United States Patent [19]

Rahn et al.

[11] Patent Number: 4,632,291

[45] Date of Patent: Dec. 30, 1986

[54] AUTOMATIC WAVE SOLDERING MACHINE

[75] Inventors: Armin Rahn, St-Jean-Sur-Richelieu; William H. Down, Brossard; Marcel Drouin, St.-Hubert; Matthew J. Rudzicz, Montreal; John F. Buszard, Ste-Anne de Bellevue; Elie Makhoul, Carignan; Ralph W. Woodgate, Brewster, all of Canada

[73] Assignee: Electrovert Ltd., Canada

[21] Appl. No.: 470,494

[22] Filed: Feb. 28, 1983

[51] Int. Cl.[4] .................. B23K 3/04; H05K 3/34; H05B 7/16
[52] U.S. Cl. ............................... 228/9; 219/388; 219/480; 228/37; 364/477
[58] Field of Search .............. 228/9, 10, 11, 37, 7, 228/102, 103; 219/388, 394, 480; 364/477

[56] References Cited

U.S. PATENT DOCUMENTS

| | | | |
|---|---|---|---|
| 4,180,199 | 12/1979 | O'Rourke et al. | 228/9 X |
| 4,196,839 | 4/1980 | Davis | 228/180 R |
| 4,363,434 | 12/1982 | Flury | 228/7 |
| 4,446,358 | 5/1984 | Comerford et al. | 228/10 |

FOREIGN PATENT DOCUMENTS 2746814 4/1978 Fed. Rep. of Germany.
2842372 4/1980 Fed. Rep. of Germany.

OTHER PUBLICATIONS

Winther, "The New Solder Machine", Banner/Technical Devices Co., Inc., 1982.
Kostick et al, IBM Technical Disclosure Bulletin, vol. 22, No. 9, pp. 3984–3985, (Feb. 1980).

Primary Examiner—Kenneth J. Ramsey
Attorney, Agent, or Firm—Darby & Darby

[57] ABSTRACT

Automatic wave solder apparatus having a fluxer section, preheater section and wave soldering section through which circuit boards are passed by a conveyor. All of the major process parameters are monitored by a microprocessor. One specific parameter controlled is the temperature of the boards exiting from the preheater system. Preheating is carried out by two axially spaced banks of heaters, the upstream one supplying the major quantity of heat and the downstream one supplying sufficient heat to boost the temperature to the desired value. A pyrometer located in the zone between the two banks of heaters measures the heat radiated from the boards and this information is converted by the microprocessor to an appropriate instruction to the second bank of heaters. The soldering section has a solder pot assembly particularly adapted to the automatic nature of the apparatus. The pot can be jacked to the correct height according to the length of leads projecting from the boards under control of the microprocessor. Irrespective of the solder pot height the structure of the solder nozzle ensures constant values for the rear flowing portion of the wave. The pot may be swung out for cleaning.

17 Claims, 20 Drawing Figures

4,632,291

AUTOMATIC WAVE SOLDERING MACHINE

FIELD AND BACKGROUND OF THE INVENTION

This invention relates to the soldering of printed circuit boards or the like in which the boards are passed sequentially through a fluxer section, a preheater section and a wave soldering section.

Prior machines of this type have been developed in which some of the process parameters have been controlled automatically but, as far as is known, no prior machine has been developed which is capable of completely automatically processing the boards through the various steps necessary to ensure efficient and reliable soldering. Perhaps one reason for this is that prior machines have not been able to achieve the degree of accuracy necessary in preheating the boards to ensure proper soldering. The following discussion with bring out the importance of preheating control.

A wave soldering machine is a machine for soldering components premounted on a printed circuit board to that board. The board is held near horizontal with components on the top surface and their leads projecting through holes in the board. Sometimes small components (chips) may be cemented to the bottom surface of the board. This board is passed over the solder wave, just skimming its surface. During this passage strong, conductive solder joints have to be formed between the components and the board. A well soldered board has the following joint characteristics.

1. All exposed copper of the board and component leads are well wetted.
2. All joints are continuous.
3. Solder has flowed through the holes in the pcb, partly by capillary action, to make nice through connections to the top surface of the board.
4. There is no bridging between component leads, pads, or tracks on the pcb causing a false circuit.
5. There are no whiskers or drips, of frozen solder hanging from the bottom of the board.
6. None of the components have been damaged by the temperature of the process.
7. There is no excessive alloying between the leads, or copper of the board and the solder.
8. There are no inclusions or impurities in the solder.

Quite a number of these qualities are affected by the temperature of the board when it meets the solder wave.

Obviously if the board is cold and is taken through the solder wave quickly the solder will freeze onto the cold board without flowing into cracks and holes and will not be forming good joints between well wetted parts.

To maintain a reasonable soldering speed and therefore production rate of boards per day the boards need heating prior to soldering. The heating has to achieve a balance between damage by thermal shock and high temperature to the board and components, or excessive soldering time required to transfer heat from the solder of the solder pot to the board.

Heating the board prior to soldering also increases the activity of the flux which improves the general solderability.

The temperature of the board is a dynamic parameter, with temperature gradients through the board which vary with time. The temperature gradients will decay with time so that a long gap between board heating and soldering will give a cooler, ever temperatured board, whereas heating in the solder wave will given a hot lower surface and cold tap surface to the board, with therefore large thermal gradients.

SUMMARY OF THE INVENTION

The heart of the present invention is the novel preheater which has two stages. When a board is put in the machine a microprocessor asks for some details of the board. It asks for the board thickness, and if possible for a board type. The type is a classification of the board which allows the microprocessor to ascribe a constant to the board to correct for emissivity, conductivity, abnormal plated areas, multilayering of circuits, or coatings which may alter heat transfer of thermal capacity. The microprocessor will also allow different temperatures to be selected to, say, protect a particularly delicate component on the board.

From this information the microprocessor will set the heat level of the first stage of heaters. The heaters are arranged in a grid in the direction of the board travel and the microprocessor only switches on the heaters under the board. Since it has already adjusted the conveyor for board width it knows which heaters cover this area. The heaters in the first section are each 1 kw, and made from a coil of nichrome wire in a quartz tube. The quartz tube is open to the atmosphere at each end. These heaters take about 2½ minutes to reach full temperature.

At the end of this section the board has been heated either so that the whole board is at near soldering temperature, or it it requires greater heat input because, say, it is a very thick board, at a level which raises the bottom of the board to the maximum which will not actually damage the bottom of the board, i.e. it is being heated at the maximum rate possible.

As the board reaches the end of this section it passes under a pyrometer which measures the temperature of the top of the circuit board. The microprocessor compares these readings with required temperature and expected temperature and then takes the appropriate action to boost this temperature with the second zone of heaters.

The solder pot is also especially adapted for obeying commands sent by the microprocessor. Specifically, it can be jacked up or down to accommodate short or long leads on the boards. Special structure on the nozzle ensures that, whether the pot be up or down, the configuration of the horizontal board exit side of the wave remains at the optimum. Furthermore, the pot can be swung out for cleaning and the nozzle structure too permits easy cleaning.

Accordingly, it is an object of the present invention to provide an improved preheater for a soldering machine.

It is an associated object to provide an improved soldering machine which permits automatic soldering of printed circuit boards.

It is another object of the invention to provide an improved solder pot especially for incorporation in an automatic machine and structered for ease of maintenance and cleaning.

DESCRIPTION OF THE PREFERRED EMBODIMENT

General Description of Process

Figure 1:
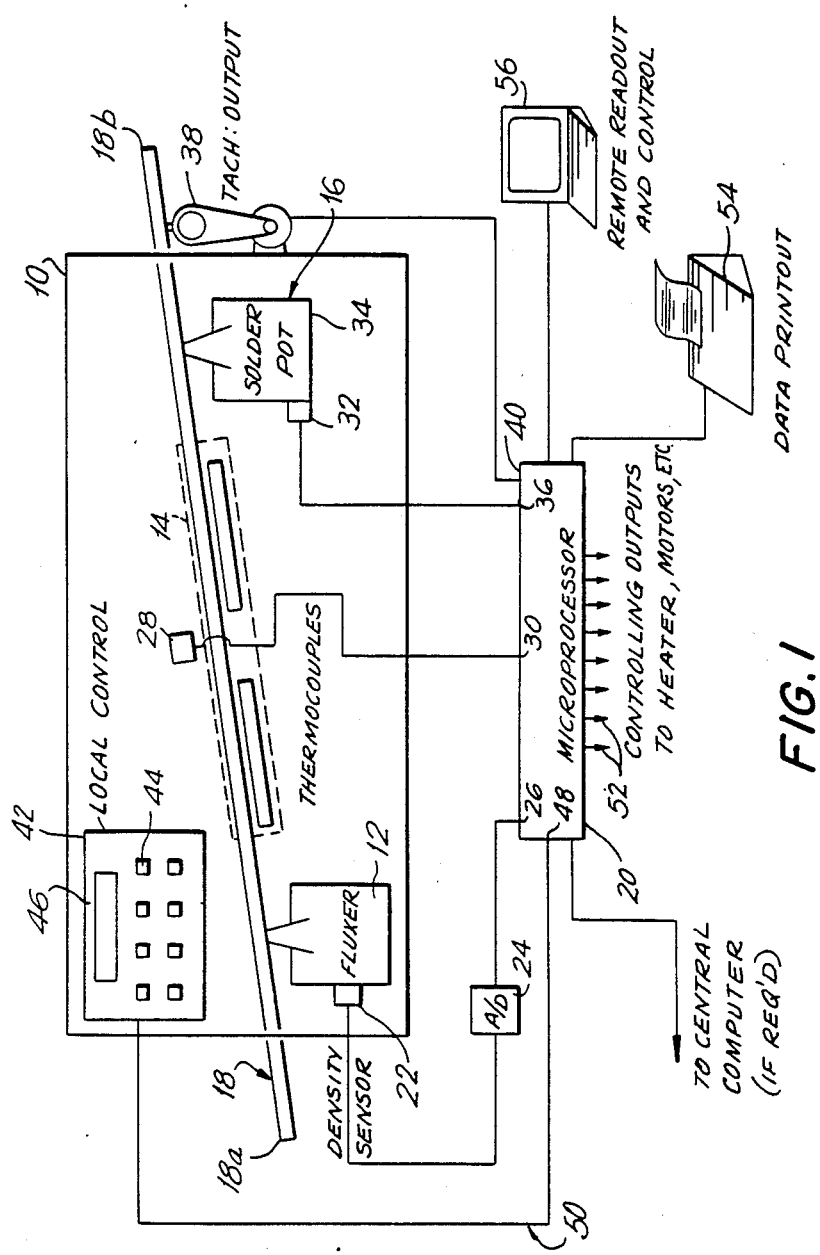
FIG. 1 is a diagrammatic view of an automatic soldering machine according to the invention, showing how the various parameters of the soldering process are controlled.

Referring firstly to FIG. 1, this shows diagrammatically some of the main features of the automatic soldering machine of the invention but various features have been omitted from this figure in the interests of clarity. The complete list of features will be described with reference to other figures, particularly FIG. 9. The soldering machine is generally referenced 10, the three principal sections of which are a fluxer section 12, a preheater section 14 and a soldering section 16. A conveyor 18 inclined at a preset angle, which can be varied between 4° and 7° with respect to the horizontal, extends entirely through the machine from a low input end 18a just before the fluxer section to a high output end 18b just after the soldering section. Conveyor 18 is designed to transport printed circuit boards from input end 18a where they are loaded to output end 18b where they are unloaded through progressively the fluxer section 12, the preheat section 14 and the soldering section 16. The printed circuit boards are not shown in FIG. 1 but they are secured with the side to be soldered facing downwardly so that it can be sprayed with flux in fluxer section 12 and, after preheating of the board in preheat section 14, it can then pass through a solder wave in soldering section 16 to solder terminals on the underside of the board.

Various parameters essential to efficient operation of the soldering process can be monitored, controlled and interrelated automatically under control of a microprocessor. Only a few of the many control functions available are illustrated in FIG. 1. For example the flux density of the flux used in the fluxer section 12 is measured using a vibration chamber type density meter 22. The output signal from the density meter is converted in A/D converter 24 to a digital signal fed to an input 26 of microprocessor 20. A pyrometer 28 for sensing the temperature of the printed circuit boards as they pass through the preheat section 14 is also shown in FIG. 1, this pyrometer deriving an analog signal which is fed to an analog input 30 of microprocessor 20. A thermocouple 32 located in a solder pot 34, constituting the major component of the soldering section 16, is provided for sensing the solder temperature and, again, the analog signal derived is fed directly to microprocessor 20, this time via analog input 36.

The speed of the conveyor 18 is measured by means of a D.C. tachogenerator 38, the signal generated being fed, via a voltage divider (not shown) to an analog input 40 of microprocessor 20.

A control console 42 includes a keyboard 44 which permits data pertinent to the process and to the boards being processed to be entered by an operator and also includes a display screen 46 on which data entered can be displayed temporarily or on which parameters sensed can be displayed as called for. Control console 42 is connected to a digital input/output port 48 by means of a cable 50.

Depending on the data entered into the microprocessor 20 via the control console 42 and via the various sensors such as sensors 22, 28, 32 and 38, the various process parameters such as flux density, board preheat temperature, solder temperature and conveyor speed can be interrelated and controlled by appropriate signals emanating from outputs of microprocessor 20. The overall process control will be described in greater detail below but first the control of the board preheat, which is considered to be an important aspect of the invention, will be described. Before moving on from FIG. 1, the presence of a data printer 54 and a remote readout and control console 56, should be noted. These are optional items which can assist in overall control of the soldering process.

Preheat Section

Figure 2:
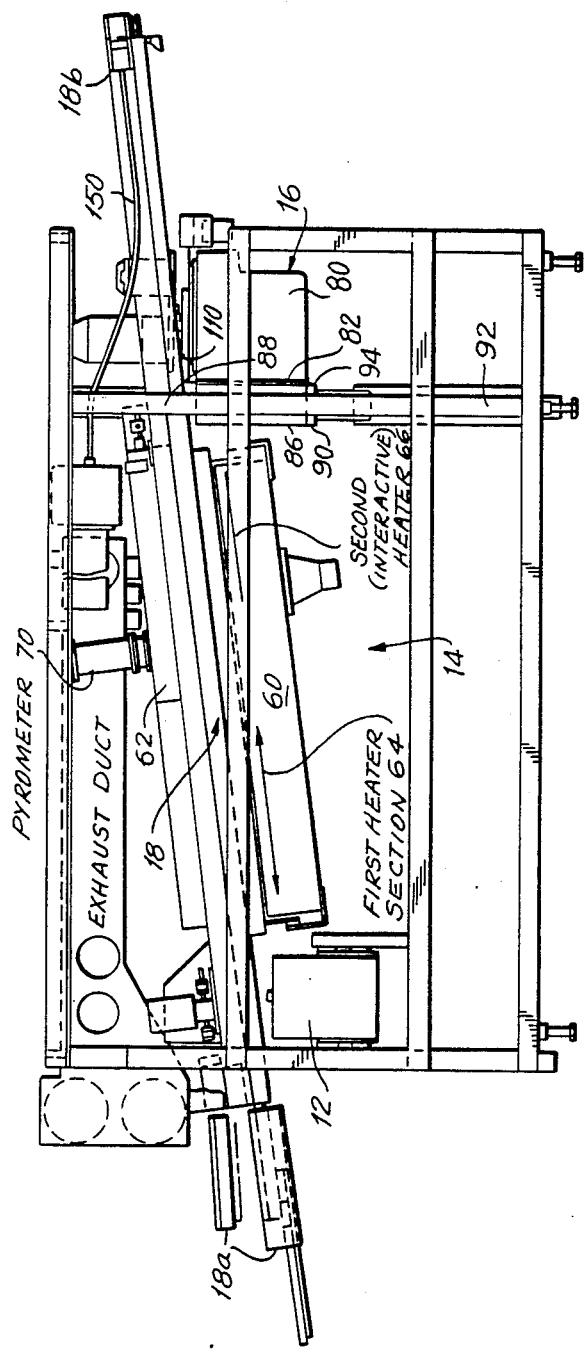
FIG. 2 is a side view of the soldering machine illustrated diagrammatically in FIG. 1, with the external housing removed for clarity.
Figure 3:
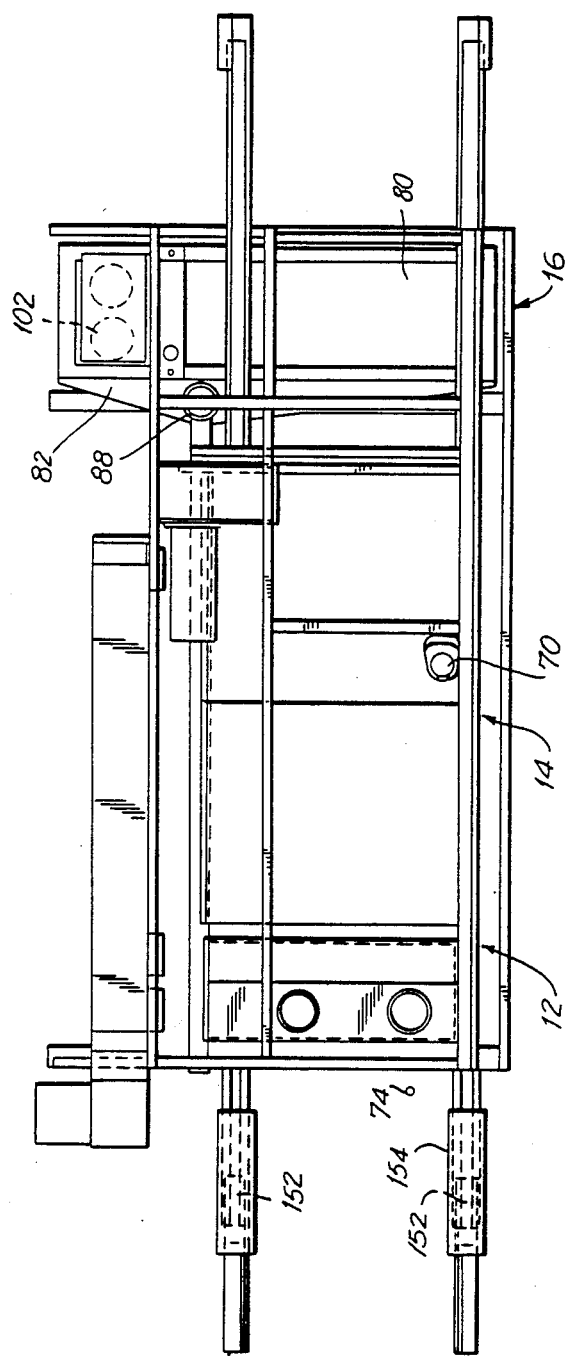
FIG. 3 is a plan view of the soldering machine of FIG. 2.
Figure 4:
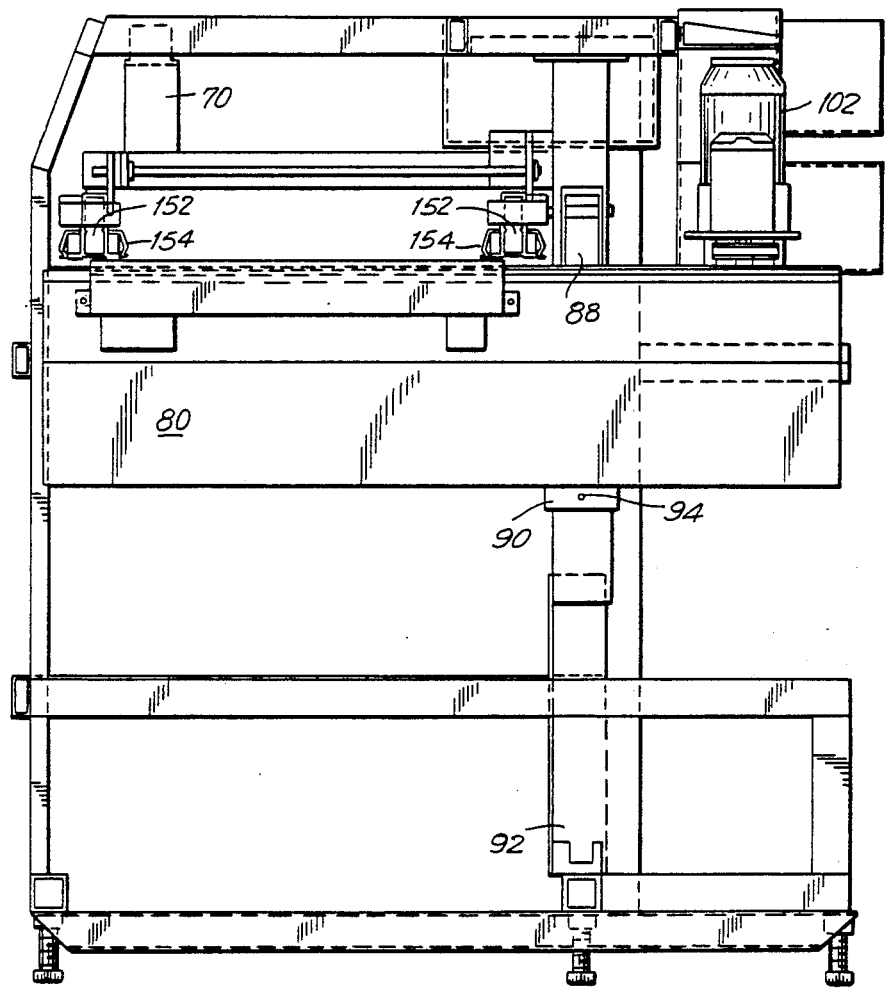
FIG. 4 is a rear view of the soldering machine looking in the direction of the arrow A in FIG. 3.
Figure 5:
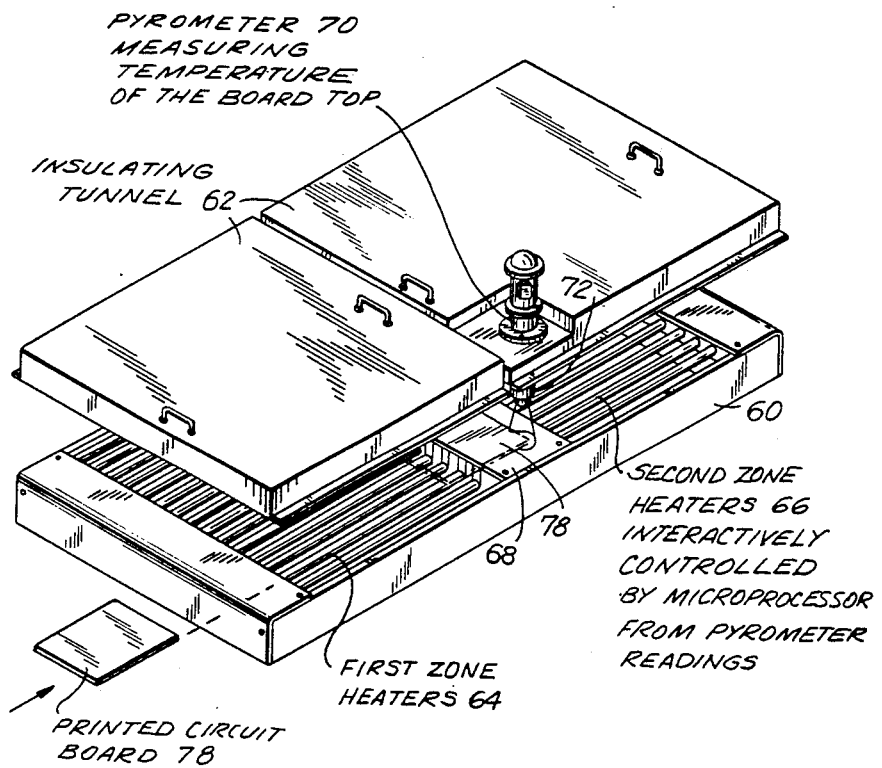
FIG. 5 is a perspective view showing a two stage preheating assembly used in the automatic soldering machine of the invention.

Referring now to FIGS. 2, 3 and 5, particularly FIG. 5, the conveyor 18 passes between a heater assembly 60 located below the conveyor and an insulating cover 62 located above the conveyor and aligned with the heater assembly. More particularly, the heater assembly 60 comprises a first bank of fifteen heaters 64 running parallel to the conveyor axis and a second bank of fifteen heaters 66 also running parallel to the conveyor axis, the second bank being displaced downstream of the first bank and separated from the first bank by a short non-heating zone 68.

The heaters 64 are all identical, each comprising a 1 kw nichrome wire coil in an open ended quartz tube. These heaters take about 2½ minutes to reach full temperature of approximately 980° C. The heaters 66 are also 1 kw but they have a very fast response time, reaching a high temperature within a few seconds. These heaters are formed with a filament in a sealed quartz tube and have a maximum temperature of around 2200° C.

The two banks of heaters are connected to a power source via relay contacts or similar switch means (not shown) under control of the microprocessor. The level to which a particular bank is energized is selected by the processor in the range 0–15 and, to this end, a variable controller such as a rheostat is provided.

Mounted on the insulating cover 62 is a pyrometer 70 (referenced 28 in FIG. 1), the temperature sensitive portion 72 of which projects through to the underside of insulating cover 62 in alignment with the non-heating zone 68 separating the two banks of heaters. It can also be seen that the pyrometer is not located centrally with respect to the width of the heater banks but is located adjacent one side, the front side as seen in FIGS. 3 and 5. The reason for this is that, as will be described below, the width of the conveyor 18 is adjustable to accommodate different widths of circuit boards. By locating the pyrometer at one side the conveyor 18 and hence boards will always pass below the pyrometer, irrespective of the conveyor width adjustment.

FIG. 3 shows the portion of a sensor 74 which senses the leading and trailing edges of the printed circuit boards. The sensor 74 is preferably a photodetector of known type, which is connected electrically to the microprocessor 20 so as to signal the positions of the boards the microprocessor.

The operation of the preheat section will now be described. As indicated above data pertinent to a particular board can be entered by an operator via console 42. With regard to the operation of the preheat section, the top operator would enter a desired value or set point (CB set point) for the side preheat temperature of the circuit boards. The desired conveyor speed would also be entered via the console. Other data which would be entered via the console 42 would be the board thickness and, probably also, board type. The board type is a classification of the board which allows the microprocessor 20 to ascribe a constant to the board to correct for emissivity, conductivity, abnormal plated area, multilayering of circuits or coatings which may alter the heat transfer or thermal capacity characteristics of the boards.

After completion of a start-up sequence to be described in detail below, the operator enters a "run" instruction via console 42 at which the microprocessor 20 instructs various functions, including running of the conveyor 18 and energization of the first bank of heaters 64. The level of energization of the heaters 64 is set by the microprocessor as a function of the conveyor speed, the temperature set point and the board data entered previously by the operator. As the circuit boards 78 pass the sensor 74, the leading and trailing ends are detected and this information passed to the microprocessor 20. When the boards emerge from the fluxer section 12 they enter the preheat section 14 where they are heated by the first bank of heaters 64 so that as they emerge into the non-heating zone 68 they are, ideally, just below the set point temperature entered previously by the operator. In some cases, particularly where the board requires greater heat input because it is, say, thick, the temperature of the board will be rather lower because the board bottom would be subject to damage if too much heat were applied by the heaters 64.

The boards 78 then pass under pyrometer 70 which measures the infrared radiation emanating from the board 78. The pyrometer is instructed by microprocessor 20 to take twenty readings 0.1 inch apart and these twenty readings are sent to the microprocessor where they are averaged or where the maximum reading is established. The correct timing for beginning the readings is established by the microprocessor as a function of the leading edge signals provided by position sensor 74 and the conveyor speed.

Essentially the averaged or maximum temperature reading provided by the pyrometer is compared in microprocessor 20 with the set point temperature and the microprocessor then sets the level of the second bank of heaters 66 at a level of intensity which will bring the boards up to the set point temperature. However, as the pyrometer is measuring indirectly the temperature of the boards by measuring the heat radiated from the boards an algorithm has to be derived to relate the pyrometer measurements to required intensity level. The following algorithm represents one way of establishing the intensity level of heaters 66:

$$\text{THETA} = \frac{(\text{CB TEMP}^* - \text{TEMP}_o^{**}) \times \text{SPEED}}{\text{CONST}_2}$$

$$\text{THICKNESS} = \frac{\text{CONST}_3 \times \text{INTENSITY}_1 - \text{THETA}}{\text{CONST}_4 \times \text{INTENSITY}_1}$$

$$A = \frac{(\text{THICKNESS})^{\frac{1}{2}}}{2}$$

$$B = \frac{\text{THETA} \times A \times \text{CONST}_5}{\text{SPEED}} + \text{CB TEMP}$$

$$C = \frac{(\text{CB SET POINT})^{***} + A \times B}{1 + A}$$

$$\text{ALPHA} = [(C - B) \times \text{SPEED}]/\text{CONST}_6$$

$\text{INTENSITY}_1$ (intensity of heaters 64) = $\text{CONST}_1 \times \text{SPEED}$ $\text{INTENSITY}_2$ (intensity of heaters 66) = $\text{ALPHA}/(\text{CONST}_7 - \text{CONST}_8 \times \text{THICKNESS})$

*Measured by pyrometer after 1st zone
**May be maximum or average depending on program initial board temperature
***Entered by operator via keyboard Switching on of heaters 66 is triggered by leading edge pulses from position sensor 75 taking into account the conveyor speed so that heaters 66 are energized just before a board 78 arrives under them. Switching off of heaters 66 is also controlled by the microprocessor 20 as triggered by the trailing edge pulses emanating from position sensor 75.

Although it might seem logical to measure the temperature of the underside of the P.C. Board since this is the surface to be soldered, in practice this would not supply the microprocessor with useful figures from which it could effectively control the second heater zone. The underside temperature when measured soon after the first heating zone tells us little except at what value the heaters were set—something we know already. Two pyrometers could be used on the lower surface of the board with a time delay between to measure the temperature decay which could yield the information required by the microprocessor, but this is a less efficient method than taking top surface temperature.

Soldering Section

Figure 6:
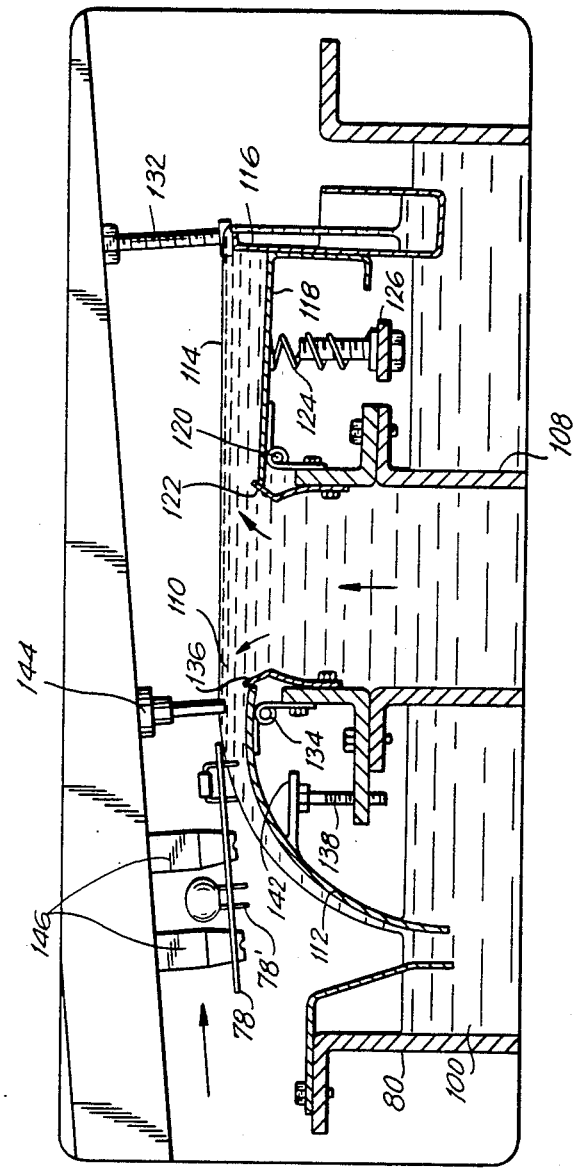
FIG. 6 is a sectional view through a solder nozzle of the machine with the solder pot in a relatively high position.
Figure 7:
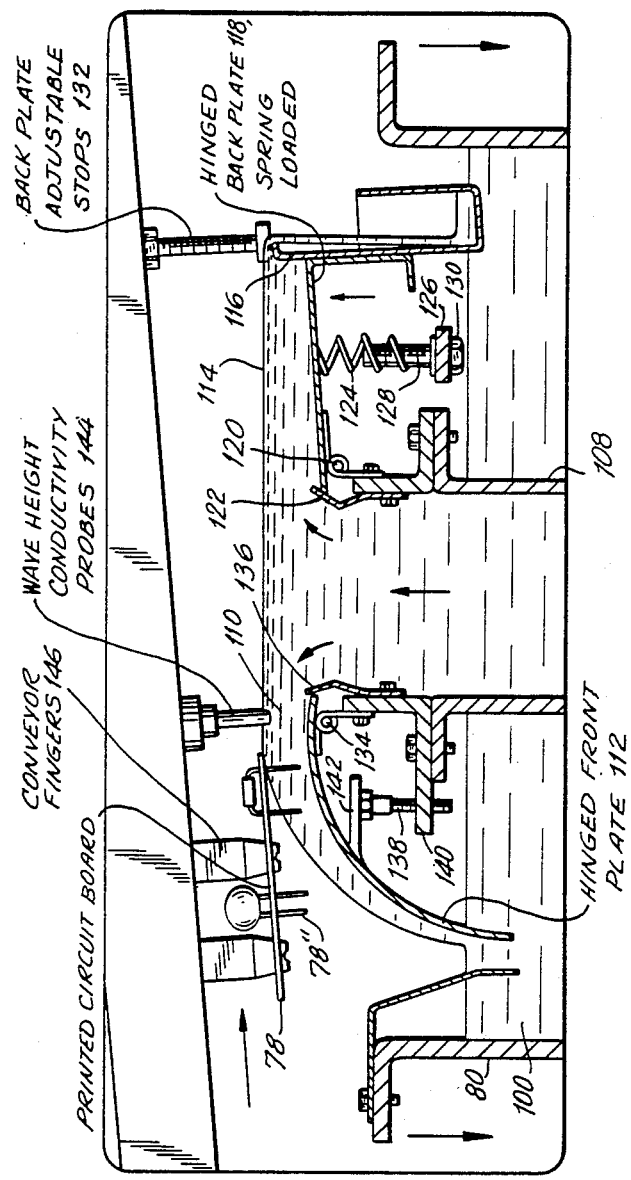
FIG. 7 is a view similar to FIG. 6 but with the solder pot in a relatively low position to accommodate printed circuit boards having long pins projecting outwardly.
Figure 8:
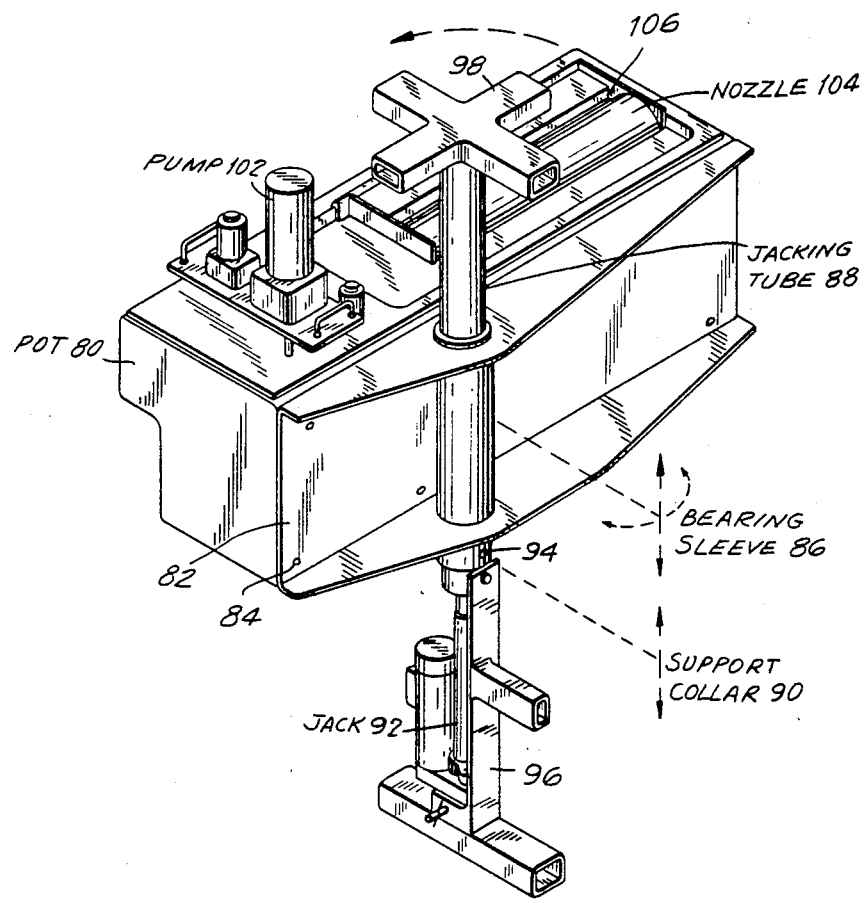
FIG. 8 is a perspective view of the solder pot assembly particularly illustrating a mechanism for raising and lowering the solder pot and for pivotting it in and out of the conveyor path.
Figure 9A:
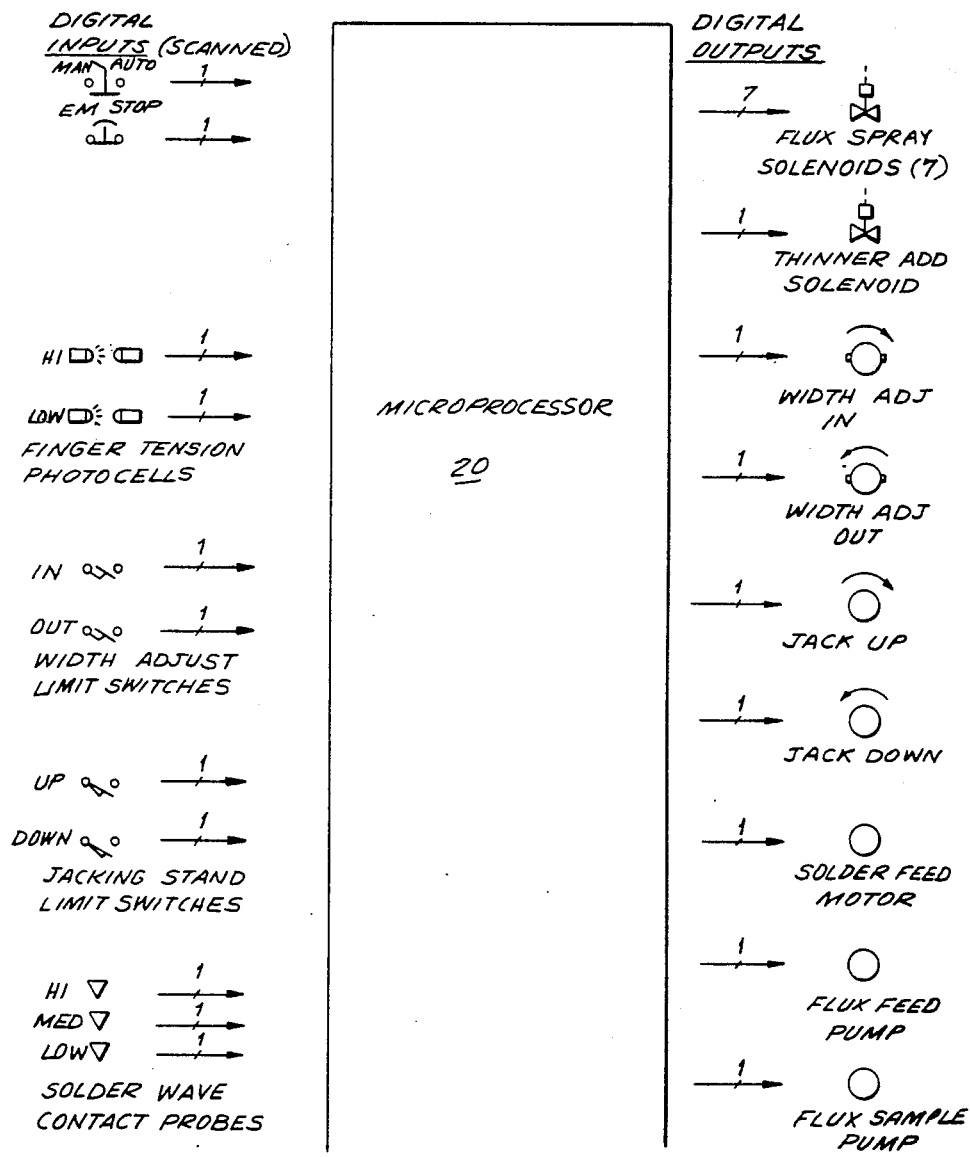
FIGS. 9A–9D comprise a schematic diagram showing to a larger scale a microprocessor shown in FIG. 1 and particularly illustrating all the various signals applied to inputs of the microprocessor and all the functions controlled by signals derived at the outputs of the microprocessor.
Figure 9B:
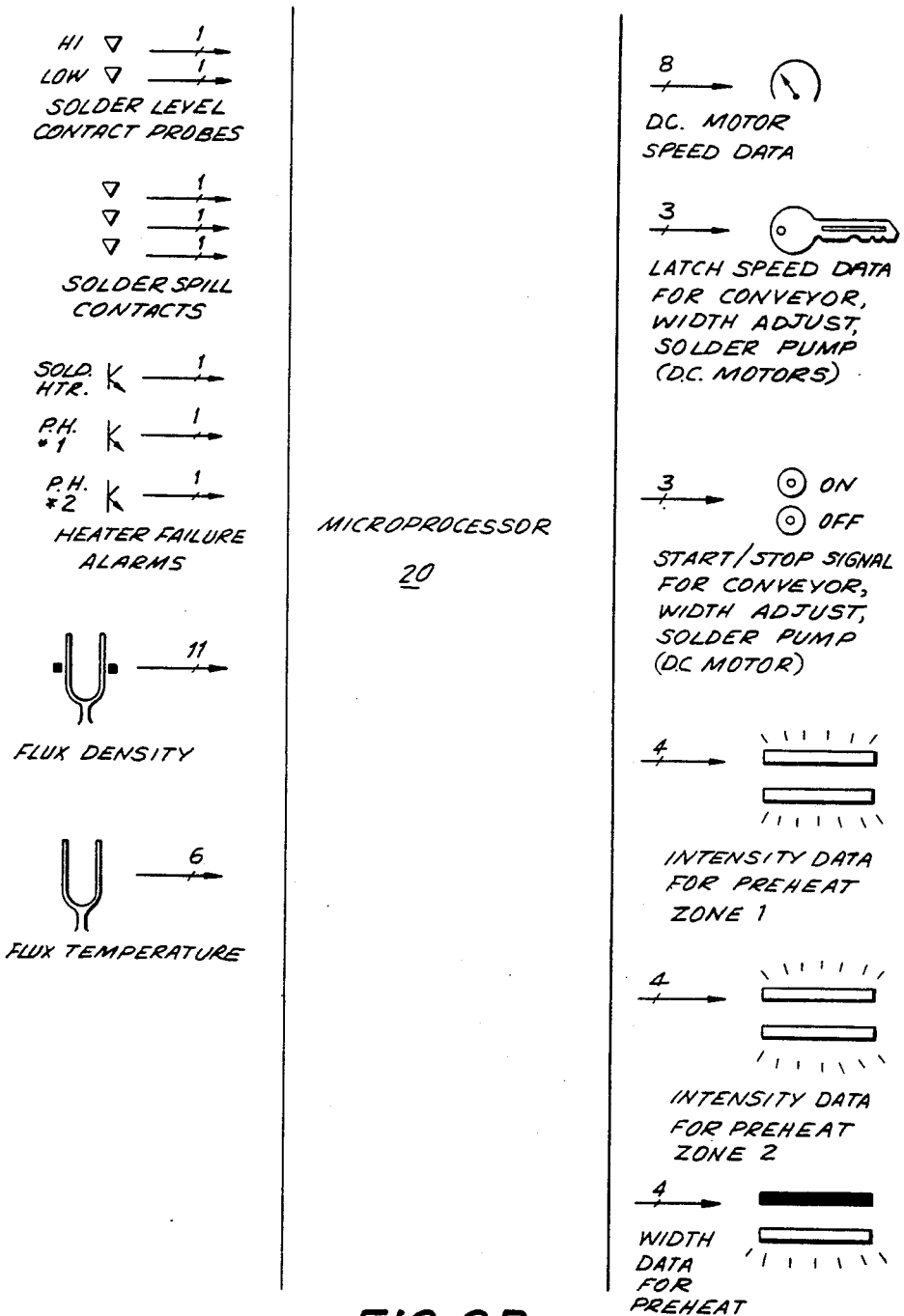
Figure 9C:
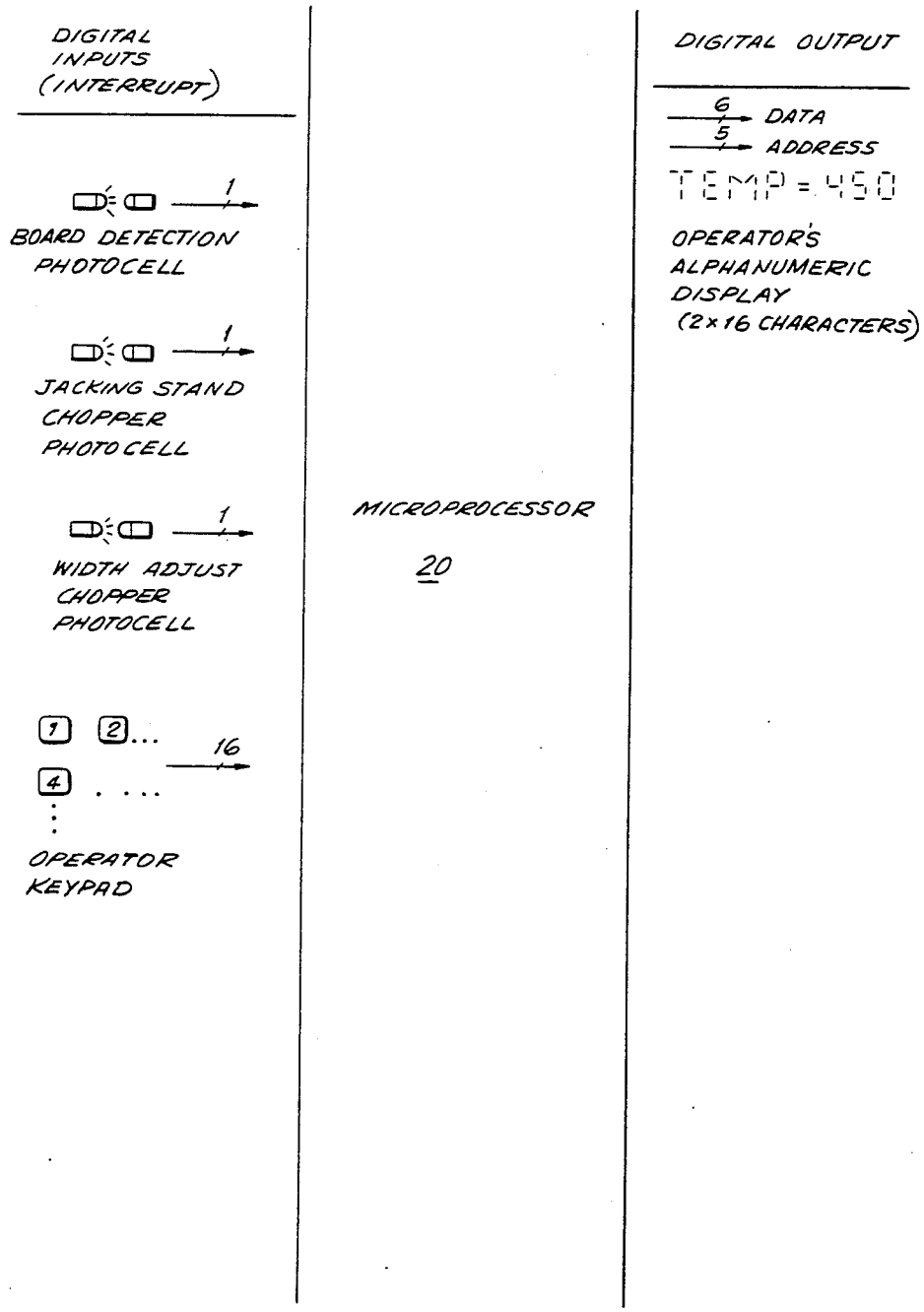
Figure 9D:
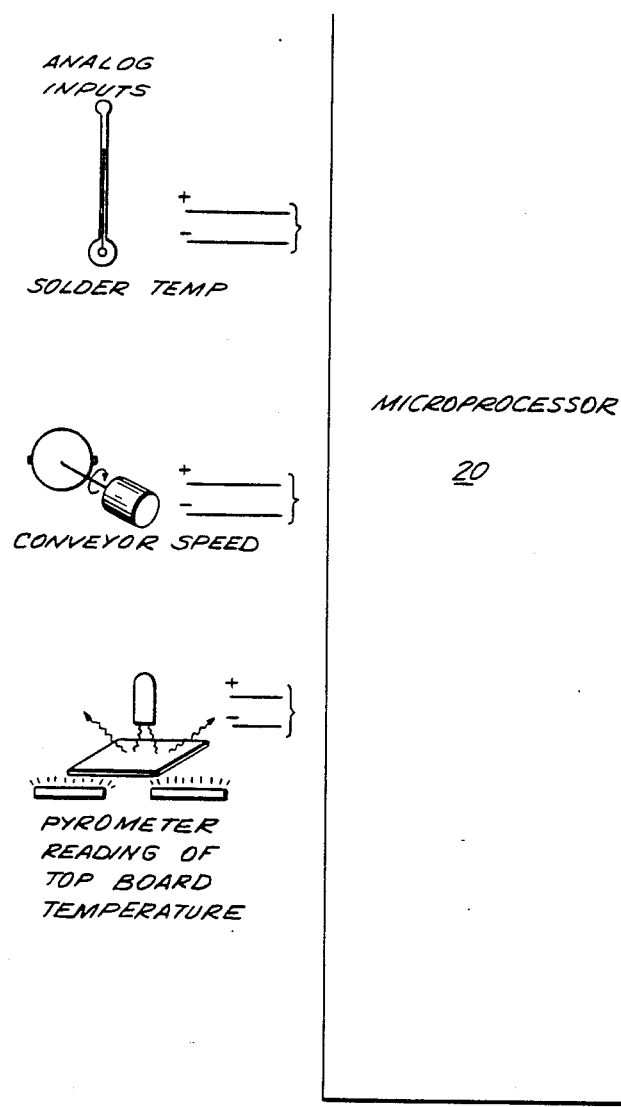
Figure 10A:
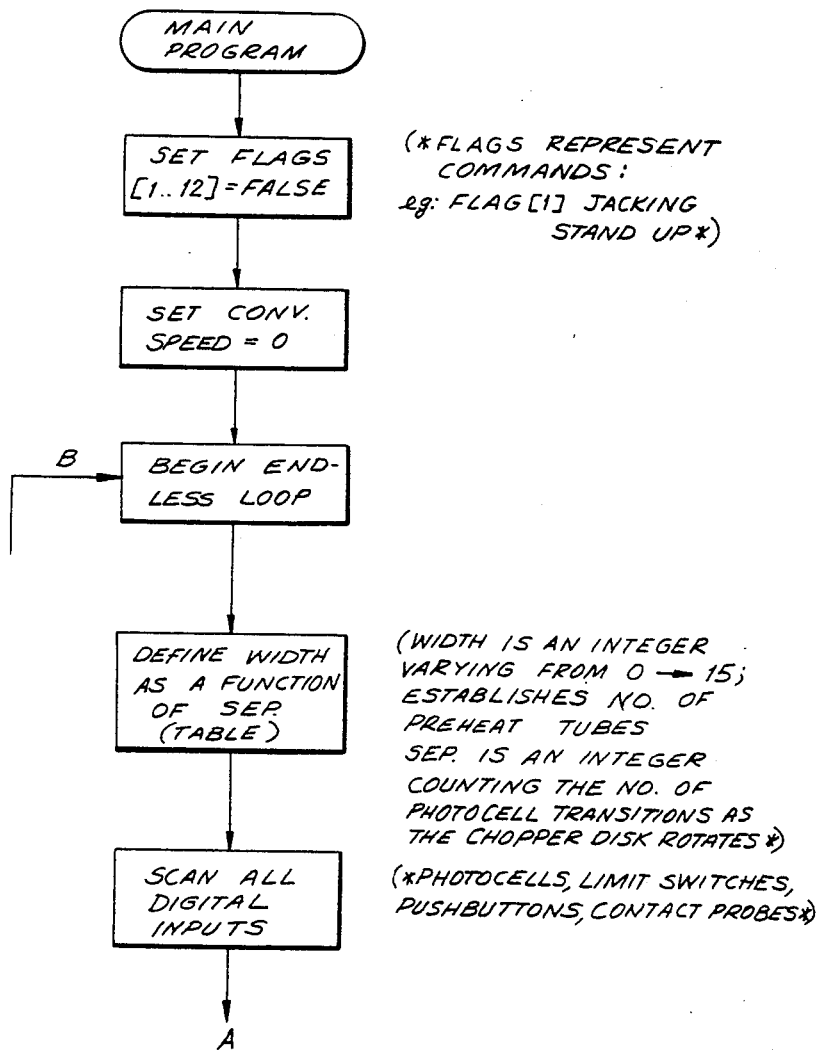
FIGS. 10A–10H comprise a flow chart illustrating the main program used to control the soldering machine.
Figure 10B:
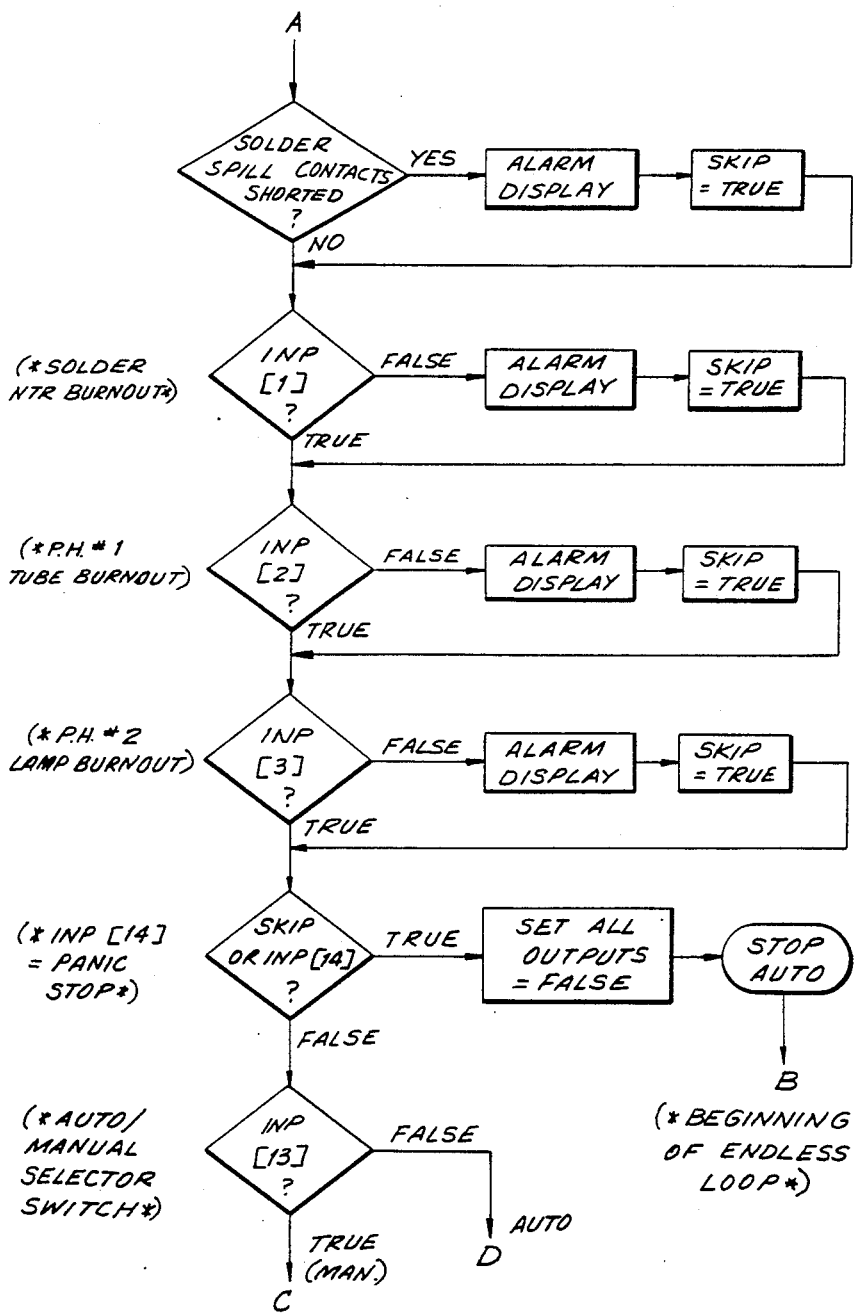
Figure 10C:
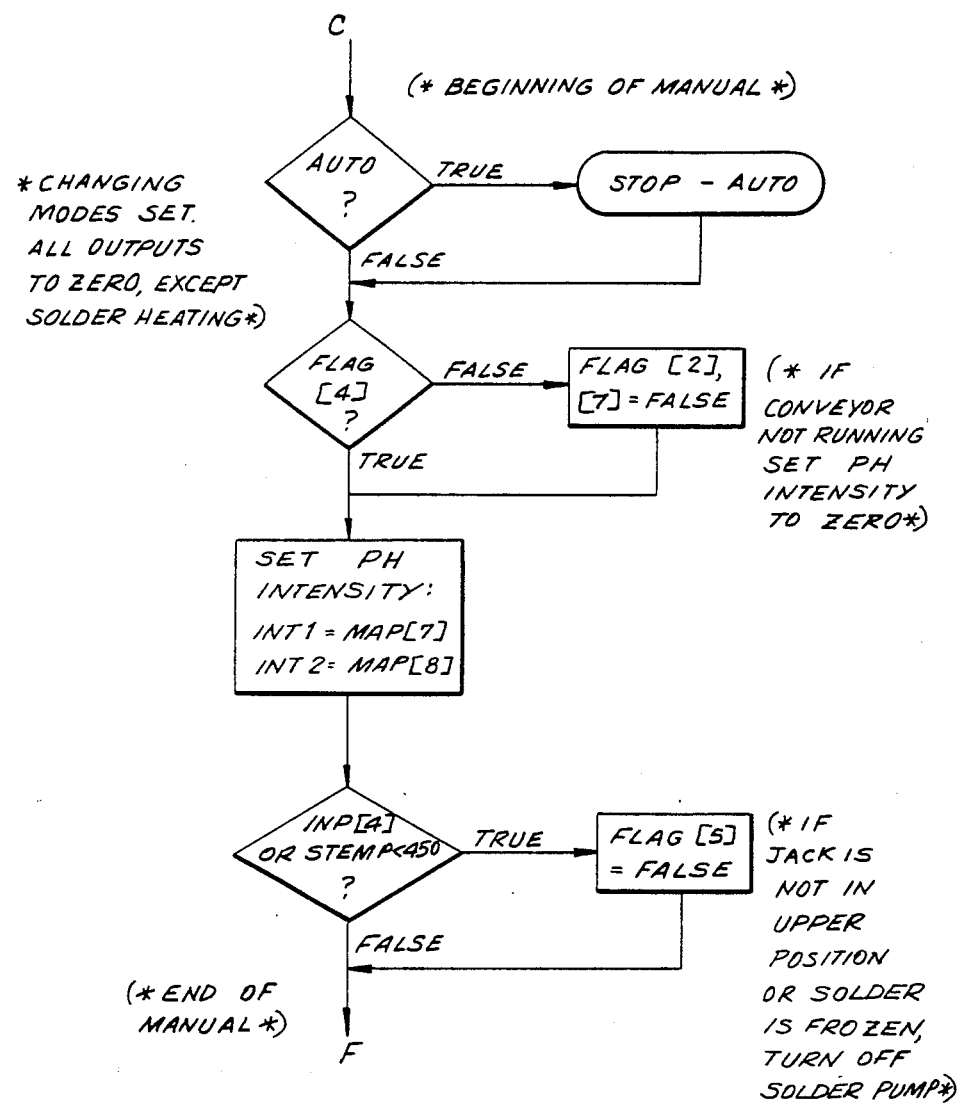
Figure 10D:
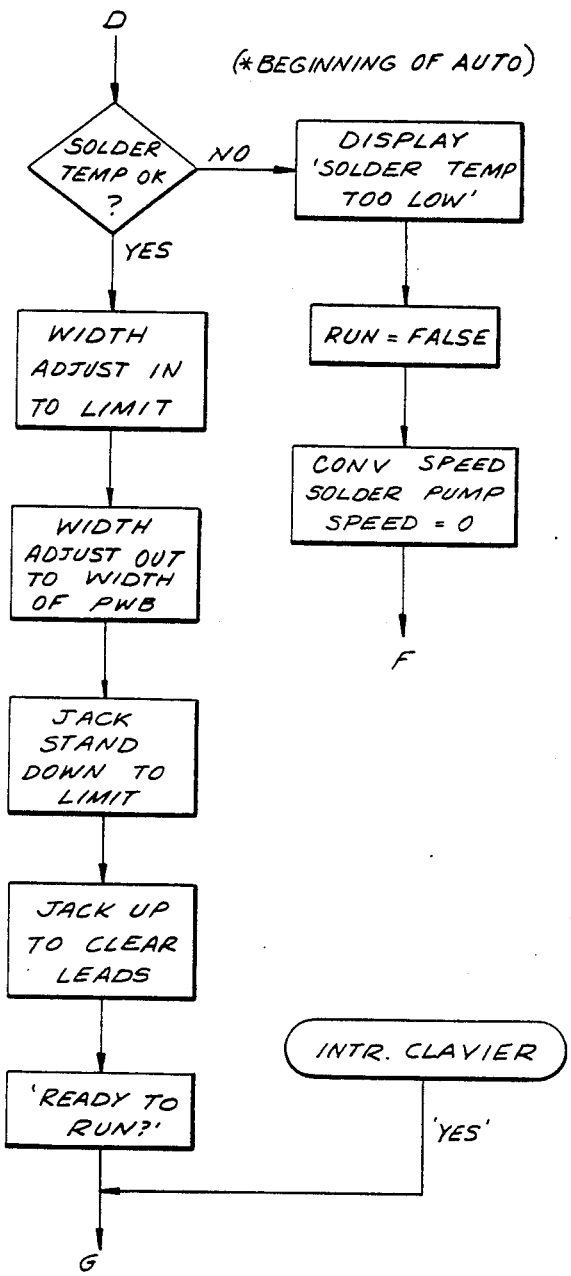
Figure 10E:
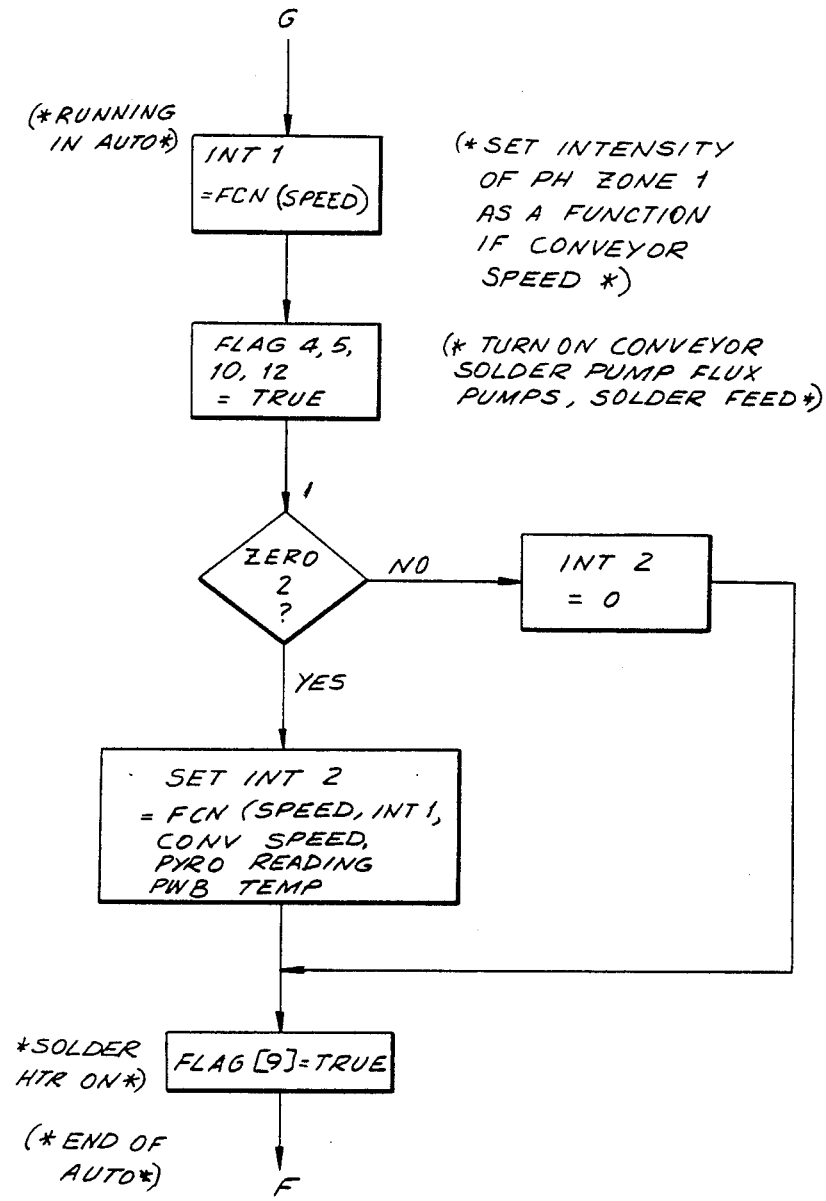
Figure 10F:
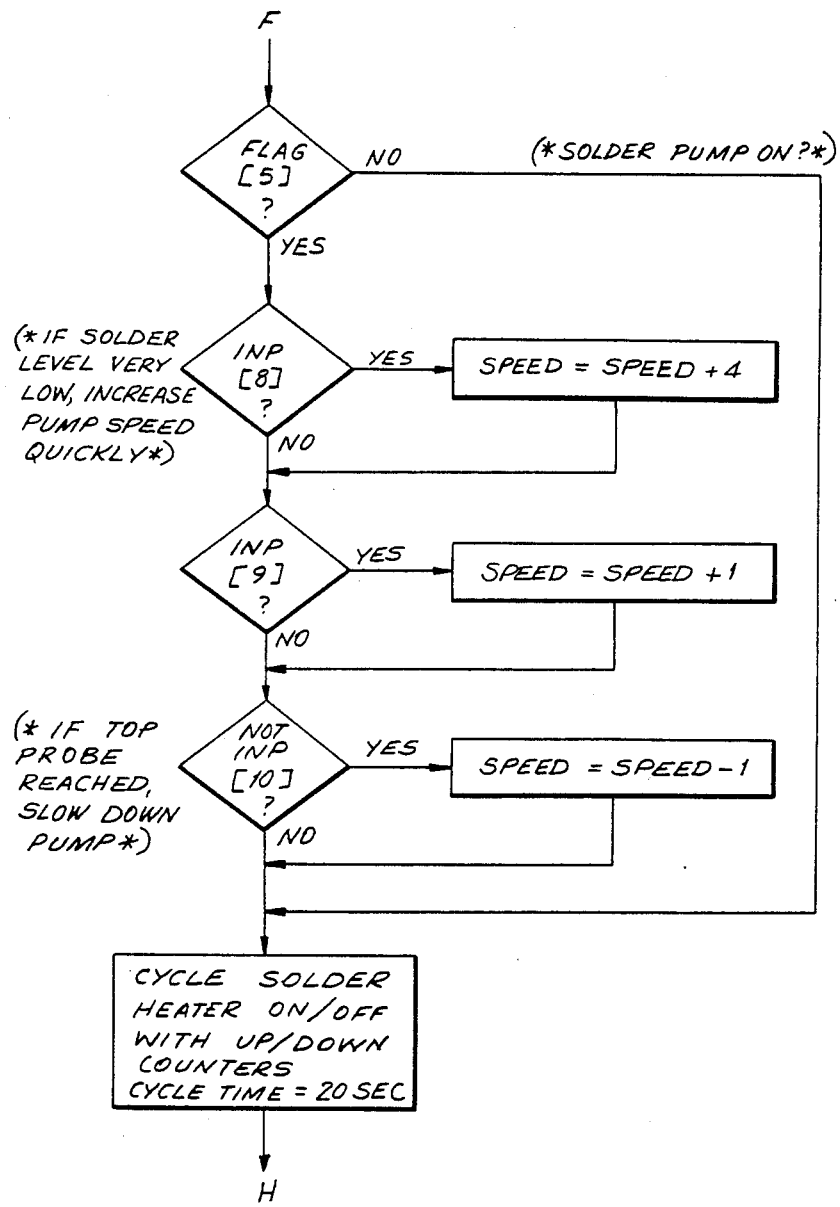
Figure 10G:
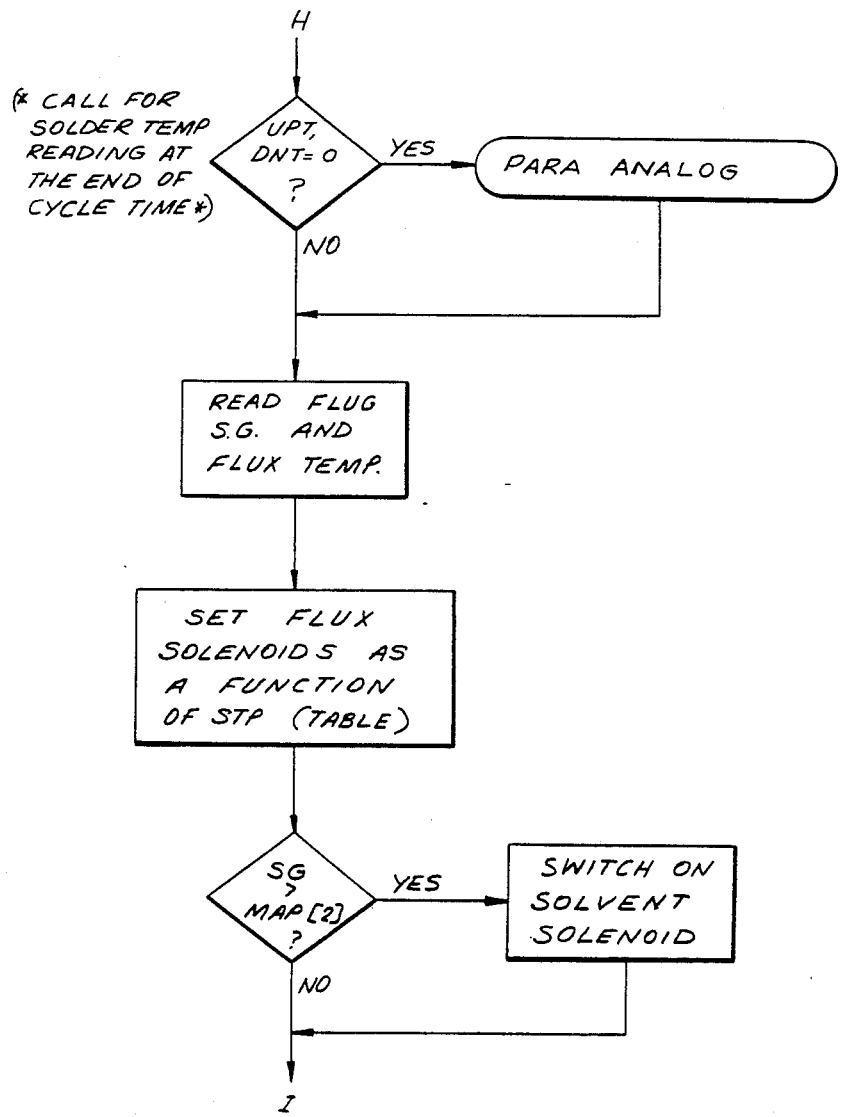
Figure 10H:
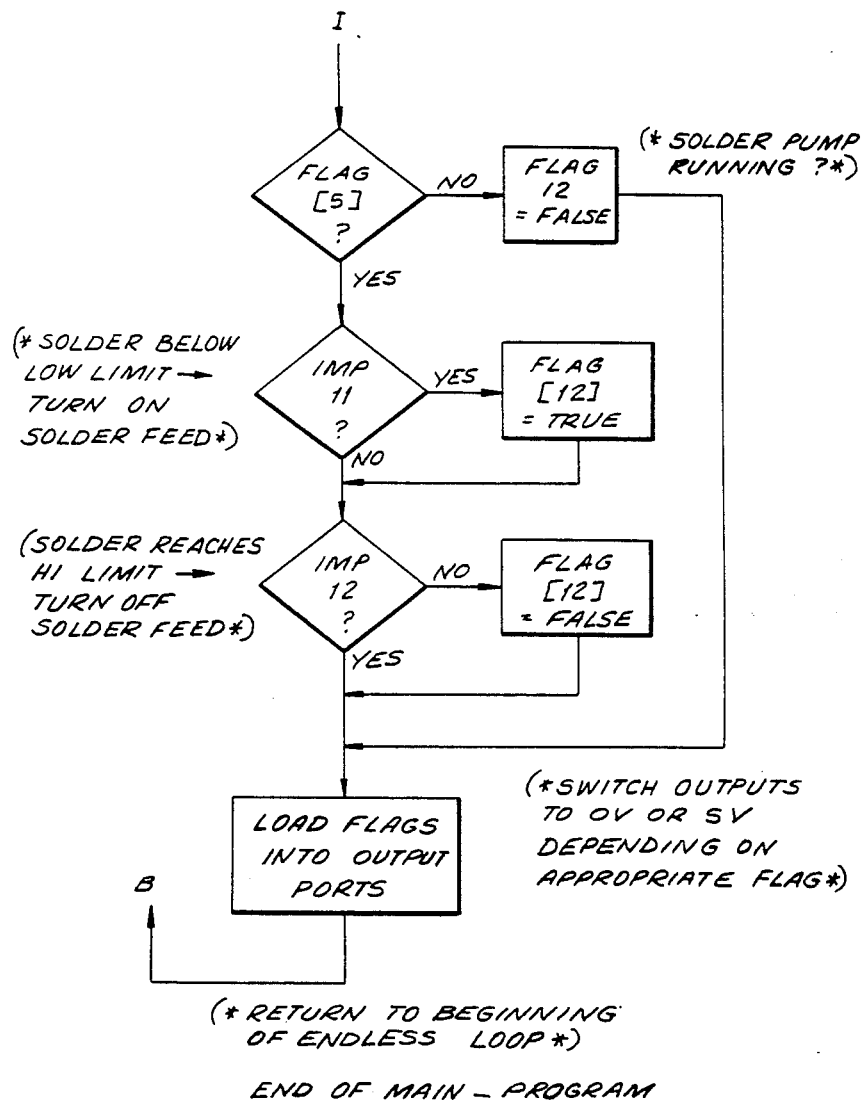

FIGS. 6, 7 and 8 illustrate most clearly the soldering section 16. The soldering section comprises principally a solder pot 80 which is secured to a holder 82 by suitable fastening means such as screw fasteners 84. Holder 82 is formed with a vertical bearing sleeve 86 which receives a post 88 extending upwardly from sleeve 86. Below sleeve 86 is a support collar 90 to which is attached a motorized screw jack 92 by means of a locking pin 94. The jack 92 is mounted on a lower frame potion 96 of the soldering machine and post 88 is secured at its upper end to an upper frame portion 98 of the soldering machine.

The solder pot 80 defines a reservoir for molten solder which is circulated by means of a pump 102 through a nozzle 104. Solder wire is fed in automatically to the pot 104 under control of the microprocessor and a heater keeps the solder molten and at the correct temperature. The general construction of the nozzle and its mode of operation is similar to that described in U.S. Pat. No. 3,421,888 which issued on Nov. 25, 1975; inventors Messrs. Elliott and Palko and assigned to the instant assignee, the disclosure of which is hereby incorporated by reference. However, the present nozzle exhibits significant structural differences from that shown in the prior patent, these structural differences particularly adapting the nozzle for use in an automatic machine.

Nozzle 104, is as seen particularly in FIG. 8, formed as an elongated slot 106 extending transversely with respect to the conveyor 18. Molten solder 100 is pumped up through a main nozzle portion 108 to exit from the slot 106 where it forms a wave 110 of solder flowing over a contoured front plate 112 and back into the reservoir for recirculation. As taught in the above mentioned prior patent some of the solder exiting from slot 106 is also caused to flow in the direction of board movement, i.e. to the rear of slot 106. Also as taught in the prior patent, the flow of this rear wave 114 is kept very small by means of a weir 116 thereby causing the surface of the rear wave 114 to move relatively slowly. As in the prior patent the weir 116 is secured to a back plate 118 but, according to the present invention, this back plate is hingedly connected to the main nozzle portion 108 rather than rigidly connected. To effect this connection a hinge 120 is provided. A spring metal sealing strip 122 mounted to main nozzle portion 108 ensures that no solder leaks between plate 118 and the top of nozzle portion 108 through the hinge. A compression spring 124 is secured at one end to the underside of plate 118 and is secured at its other end to a solder pot portion 126 using a bolt 128 and nut 130, the spring biasing plate 118 and weir 116 upwardly. An adjustable stop 132 projects downwardly from the conveyor frame and engages at its lower end the upper end of weir 116.

Contoured front plate 112 is hinged and sealed in a manner similar to that described above in relation to back plate 118 by means of hinge 134 and spring strip 136. A screw adjuster 138 is threadably received through a horizontally projecting portion 140 of main nozzle portion 108 and the upper end of screw adjuster 138 engages the underside of a member 142 extending rearwardly from the underside of front plate 112.

Also shown in FIGS. 6 and 7 is a wave height conductivity probe 144 and fingers 146 forming part of conveyor 18 and which grip the boards 78 to transport them through the soldering machine.

The reason for requiring solder pot 80 to be capable of rising and descending is to accommodate circuit boards with different lengths of leads projecting from their undersurface while ensuring that wave depth is kept to a minimum to provide shallow, stable waves producing a minimum of dross. FIG. 6 shows the situation when the printed circuit boards 78 have short leads 78'. The top of the solder wave is sensed by sensor 144. In actuality sensor 144 comprises three small titanium rods. Microprocessor 20 adjusts the speed of pump 102 so that the solder level is maintained between the two lowest rods which have a height difference of about 0.020" with the third rod acting as an emergency high level warning. In the FIG. 6 situation the microprocessor has caused jack 92 to raise pot 80 to a high level. It can be seen that weir 116 is held by stop 132 at a level such that there is just overflow over the weir. This, as more fully described in the above mentioned prior patent, is necessary for best soldering results.

When now the machine has to solder boards 78 having long leads 78" an adjustment to the wave depth must be made so that the leads 78" clear the nozzle. The solder pot 80 is lowered using jack 92 and to raise the solder wave height to the level it was at previously the pump 102 is speeded up, thereby reaching the situation shown in FIG. 7. The spring bias of plate 118 and the cooperation of stop 132 keeps the weir at the same height as before. In this way the critical feature of ensuring a constant flow of rear wave 114 irrespective of the type of board processed is achieved automatically.

It should be added that, as part of the overall control, data identifying lead length is entered by the operator in the microprocessor via the console 42 before the soldering process begins. In this way, the microprocessor can instruct jack 92 to raise or lower solder pot 80 as appropriate. Feedback to the microprocessor to position it at the instructed height is obtained by a rear counter (not shown) which counts the revolutions of the jack screw.

It is pointed out that slight variations in the wave depth are of no consequence providing there is clearance between the leads and the nozzle, providing the top surface of the wave 110 is in the correct position with respect to the board and the height and flow of the rear wave 114 is also correct.

Screw adjuster 138 permits limited adjustment of the shape of the front portion of the wave as desired.

With regard to maintenance and cleaning of the solder pot, easy accessibility is ensured simply by lowering the pot and swinging it out from under conveyor 18 around post 88. Moreover, the nozzle does not have to be removed for cleaning. Hinging the front and rear plates 112, 118 allows them to be swung out of the way for cleaning.

Conveyor

The finger type conveyor 18 is powered by a flexible shaft 150 which is DC driven, and uses hard coated anodized aluminum rails 152. Speed is controlled by microprocessor parameters and infinitely variable from 0–3 m/min (0–20 fpm). Fingers 154 are made of spring titanium, providing an even clamping force regardless of board irregularities or thermal expansion. Boards 78 can be end or top loaded into conveyor 18. Width is automatically adjusted by microprocessor 20 at a predetermined pressure on boards and is monitored constantly using pressure sensor 156 (FIG. 3). The standard conveyor is set at 5° inclination but is manually resetable from 4° to 7°. A rotating brush finger cleaner with solvent wash keeps fingers clean and flux free. Pallet conveyor is optional and there is also adequate space beneath machine for return conveyor when required.

Fluxer Section

The fluxer used is preferably a globular type spray fluxer 12 which deposits flux on underside of board by means of 7 adjustable venturi nozzles (not shown) which produce a fine mist of microscopic globules. Spraying width adjusts automatically to conveyor width and it operates only when a board is in the flux station. Flux level and density are automatically controlled and monitored by the microprocessor, with replenishment from a central flux and thinner reservoir. The spraying action is powered by compressed air (no electric motor), thus eliminating risk of ignition of hazardous atmospheres. In addition, exhaust vents located around and directly above flux station assures removal of residual fumes. Other optional fluxers are also available.

Process Control Functions

As indicated above, FIG. 1 illustrates sensors and microprocessor outputs for monitoring some of the process parameters. For a more detailed indication of the controllable parameters reference is now made to FIG. 9 which shows all of the inputs to and outputs from the microprocessor. The following list summarizes the major process parameters controlled.

1. Solder Temperature: Temperature is sampled by means of a thermocouple, linearized and cold-junction compensated via a transducer. This signal is then fed into a differential analog port on the microprocessor board. The control algorithm is two-mode (proportional/integral) and is used to switch a solid-state relay which, in turn, switches the cartridge heaters ON and OFF. Bandwidth is 50° F. and cycle time is 20 seconds.

2. Conveyor Speed: Speed is measured by a DC tachogenerator and fed, via a voltage divider, into the analog port on the microprocessor. The control program is proportional (i.e. correction of speed is directly proportional to the measured error). The resulting datum is fed, via an 8-wire bus, to a digital/analog converter which in turn controls a DC variable speed drive.

3. Flux Density: Flux density is monitored by means of a vibration chamber and is entered to the microprocessor as an 11-bit binary number, ranging from 0 to 2.047. Flux temperature is also monitored and represented as a 6-bit binary number. Should the measured value, after temperature compensation, prove greater than the set-point, thinner is added through a gravity-fed solenoid.

4. Preheat: This control function was described in detail above.

5. Width Adjustment: In the automatic mode, the rails move in or out to adjust to the board width the operator has punched in. Position measurement is performed with a photocell/chopper disk mounted on the drive shaft of the width adjust mechanism. In the manual mode, the in/out movement is toggled by the operator on his control panel. Movement override is provided by limit switches at the extremes and by finger tension, which is sensed by a spring-loaded plunger cutting a photobeam.

6. Height Adjustment: In the automatic mode, the jacking stand containing the solder pot moves up or down to adjust the lead length the operator enters. That is, the shorter the component leads on the board, the higher the jacking stand moves the pot. Position is measured with a photocell/chopper disk located on the jacking motor shaft. In the manual mode, up/down movement is toggled by the operator on his control panel. Movement override is provided by limit switches at the extremes.

7. Solder Feed: Two contact probes provide sensing for the solder wire feeder. If the solder falls below the level of the lowest probe, the solder feed motor starts feeding. It switches off when the upper probe is reached.

8. Solder Wave Height: While the solder pump is running, three contact probes located over the wave are being scanned. If the wave is below the lowest probe, pump speed is increased by approximately one part in fifty every 200 milliseconds. If the wave covers the first probe, but not the middle one, pump speed is increased by four parts in a thousand in the same time. If the wave is between the two upper probes, no adjustment is made. If it touches the upper probe, pump speed is decreased by four parts in a thousand every 200 milliseconds.

9. Flux Spray: Whenever the flux spray is switched on, whether manually or automatically, the number of spray solenoids varies with conveyor spacing.

10. Preheat Selection: Similarly, whenever preheat is called for, the number of tubes and lamps varies with conveyor spacing.

Interlocks

1. The solder pump cannot run if solder temperature is below the eutectic point or if the pot is not in the upper position.

2. The width/height adjustments cannot be made while the conveyor is running. This is true for both the automatic and manual modes.

3. Solder pumps cannot be started while the jacking stand motor is running.

4. Solder feed can only run if the solder pump is running.

5. Both preheat zones are set to zero intensity if the conveyor stops.

OPERATIONAL MODES

The auto/manual mode selection is made via a selector switch on the control console. Switching modes turns off all functions except solder heating, if that had been on previously.

1. Manual: In the manual mode, each function is selected individually by the operator, using the keys inside the outlined area on the right hand keypad. Control is toggled, i.e. to switch a function on, a key must be pressed; to turn it off the same key must be pressed again. If a function calls for a SHIFT key before being switched on, the SHIFT must be keyed again to toggle off. Interlocks mentioned in the previous section may prevent a given function from running.

2. Automatic: Solder heating begins immediately. If the temperature is too low, the operator is so informed, and nothing further happens. If temperature is satisfactory, the operator is asked to check the current values for height and width adjustment, and to then press the START key. Doing this initializes first the width, and then the height adjustment. Once this is finished, the operator is asked if he wishes to start running the machine. If he answers YES on the keyboard, the conveyor and solder pump start up, as well as solder feed and flux pump. Preheat zone 1 is set as a function of conveyor speed. Flux spray and preheat zone 2 will activate only on the presence of a board.

Code

All set-points are protected by means of a code which must be entered before any new data is accepted by the microprocessor. If the code has not yet been keyed in, as soon as the operator presses the ENTER key, a code request is flashed on the display. When he enters the correct code, it is acknowledged by the microprocessor and remains valid for five minutes. During that time any new set-point may be entered. The timer may be reset at the end of five minutes by entering the code again. An operator who does not have access to the code may interrogate the machine at any time concerning set-points or actual parameters, but will not be allowed to change any set-points. The code request prompt on the display may be cleared by pressing any non-numerical key.

Data Entry

Entering set-points is done by first pressing the appropriate key SOLDER TEMP, FLUX S.G., PWB TEMP, CONV. SPEED, LEAD LENGTH, or PWB WIDTH. The data is then entered into a shift register. When the operator is satisfied, he presses ENTER, and the value displayed is stored in memory. The code must, of course, first be entered as described in the previous section. Each of the parameters has a preset maximum and minimum which the operator is not allowed to exceed. Up to twenty tables of set-points may be entered by using the PWB TYPE key. After a set of six set-points has been keyed in, the operator may press PWB TYPE and then, say 14. The six set-points are now established for that board type. Should the operator now wish to set up for board type 3 (assuming the appropriate table had been defined earlier), he presses PWB RUN and then 3. This refers to the board currently in the machine.

RUNNING PWB'S

Up to twenty boards are tracked inside the machine. Their presence is first detected by a photocell at the load end of the AWSM. A leading and trailing edge position for each board is continuously updated while it is inside the machine. These data are used to switch the fluxer and second zone preheat at the appropriate time. No adjustments in jacking stand height or conveyor width are permitted while any boards are inside the machine.

FIG. 10 is a flow chart of the main control program. It is believed that a suitable program listing could easily be derived from this flow chart and, accordingly, the present disclosure is complete without including such program listing.

While a specific embodiment of the invention has been shown and described in detail to illustrate the application of the principles of the invention, it will be understood that the invention may be embodied otherwise without departing from the scope of the invention. For example the novel preheater section could be incorporated in a machine which does not exhibit all the features of the preferred embodiment. More particularly, the soldering section need not be formed in the so-called lambda configuration with a portion of the wave flowing over a weir as described.

What we claim as our invention is:

1. A heater for use in heating circuit boards to a predetermined temperature in a machine having a conveyor which carries the circuit boards through a soldering section of the machine, the heater comprising first heater means adjacent the conveyor for applying a first quantity of heat to the circuit boards, temperature sensing means adjacent the conveyor and deriving signals indicative of the temperature of the circuit boards as they exit from the first heater means, second heater means adjacent the conveyor and downstream of the first heater means for applying a second quantity of heat to the circuit boards, and control means having an input for setting said predetermined temperature, an input supplied by the signals from the temperature sensing means, a control output at which are derived control signals controlling the second quantity of heat supplied by the second heater means to change the temperature of the circuit boards so that as they exit from the second heater means they are approximately at the predetermined temperature, the control means also including means for selectively storing data corresponding to thermal characteristics of the circuit boards and processing means for converting the signals from the temperature sensing means to adjusted signals as a function of said thermal characteristics of the boards, the adjusted signals representing the temperature of the boards.

2. A heater according to claim 1 in which the temperature sensing means is disposed spaced from the circuit boards to sense infrared radiation emitted from the tops of the circuit boards as they exit from the first heater means.

3. A heater according to claim 2 in which the temperature sensing means is disposed above the conveyor in a non-heating zone intermediate the first and second heating means to sense the infrared radiation emitted from the tops of the boards.

4. A preheater according to any of claims 1 to 3 wherein the control means adjusts the heat supplied by the second heater means according to the conveyor speed and the axial length of the second heating means.

5. A heater according to any of claims 1 to 3 wherein the control means has a further control output at which are derived further control signals controlling the first quantity of heat supplied by the first heater means according to the desired predetermined temperature, the conveyor speed and the axial length of the first heater means.

6. A heater according to any of claims 1 to 3 wherein the second heater means are fast response heater lamps.

7. An automatic soldering machine comprising:
a preheater having a first section and a second section and a soldering section containing molten solder therein,
conveyor means for holding and conveying sequentially circuit boards through the preheater and soldering sections thereby to solder conductive members of the boards,
at least one sensing means for sensing at least one predetermined process parameter as said circuit boards are sequentially conveyed therethrough,
means for selectively storing data corresponding to thermal characteristics of the circuit boards,
processor means for converting the signals from the sensing means to corresponding process signals representative thereof as a function of said thermal characteristics of the boards, the processor means deriving control signals from the input stored data and process signals, and
means for varying the process parameters of the machine under control of the control signals from the processor means,
wherein one of said input stored data corresponds to a predetermined temperature for said circuit boards prior to entering said soldering section, one of said sensing means sensing the temperature of a board upon leaving said preheater first section and producing a first process signal representative thereof, said preheater second section being responsive to said derived control signal of the processor means.

8. A soldering machine as in claim 7 further comprising a solder pot for applying solder to the exposed metallic surfaces on the undersides of circuit boards carried by the conveyor, said conveyor having a sloping path, said solder pot having a reservoir adapted to contain molten solder, a nozzle communicating with the reservoir and having a solder outlet positioned above the reservoir, a front plate attached to one side of the solder outlet and establishing the contour of a solder wave flowing over the one side of the solder outlet, a weir means attached to the other side of the solder nozzle and establishing a virtually horizontal, smooth solder wave flowing from the other side of the solder outlet, the weir means being spring biased upwardly for engagement with a stop member related to the conveyance path of the printed circuit boards.

9. A soldering machine as in claim 7 wherein one of said input data corresponds to a predetermined temperature for said boards prior to entering said soldering section, said sensing means sensing the temperature of a board upon leaving said preheater section and producing a first process signal representative thereof, and further comprising further preheater means responsive to a first control signal produced by said processor means in response to said first process control signal and said input data corresponding to board temperature.

10. A soldering machine as in claim 8 wherein said data input comprises data representative of the temperature of the solder in the solder section and the printed circuit board temperature prior to entering the solder section.

11. A soldering machine as in claim 7 wherein one of said input data corresponds to a predetermined temperature of the solder in the solder section, said sensing means sensing the temperature of the solder and producing a second process signal representative thereof, and further comprising heater means for said solder section responsive to a second control signal produced by said processor means in response to said second process signal and the input data corresponding to the predetermined temperature.

12. A soldering machine as in claim 7 wherein one of said input data corresponds to the speed of the conveyor means, said sensing means sensing the speed of said conveyor means and producing a third process signal representative thereof, and further comprising means responsive to a third control signal produced by said processor means in response to said third process control signal and the input data corresponding to conveyor speed.

13. A soldering machine as in claim 7 further comprising a fluxer section through which said circuit boards pass, and further comprising a sensing means for each of said preheater, soldering and fluxer sections to produce a respective process signal for application to said processor means.

14. A soldering machine as in claim 13 wherein one of said input data corresponds to a predetermined density of the flux of said fluxer section, said sensing means sensing the density of the flux and producing a fourth control signal representative thereof, and further comprising means responsive to a fourth process signal produced by said processor means in response to said fourth process signal and to the input data corresponding to the flux density to control the density of the flux to said predetermined density.

15. A soldering machine as in claim 7 wherein one of said input data corresponds to a predetermined width of said printed circuit boards, and means adjacent said conveyor means responsive to a fifth control signal produced in response to printed circuit board width input data for adjusting the width of said conveyor means to correspond to said predetermined width.

16. A soldering machine as in claim 7 wherein one of said input data corresponds to a predetermined lead length of the components extending from said printed circuit board, said processor means producing a sixth control signal in response to said lead length input data, and further comprising means responsive to said sixth control signal for adjusting the height of said solder section relative to said boards.

17. A soldering machine as in claim 7 further comprising means for supplying molten solder to said solder section, means for sensing the height of the solder wave in said solder section, and means responsive to said solder wave height sensing means for increasing the supply of solder to said solder section when the height of the solder wave sensed falls below a predetermined level.

* * * * *